(12) United States Patent
Ramorini et al.

(10) Patent No.: US 10,566,940 B2
(45) Date of Patent: Feb. 18, 2020

(54) SENSING CIRCUIT, CORRESPONDING AMPLIFIER, APPARATUS AND METHOD

(71) Applicant: STMicroelectronics S.r.l., Agrate Brianza (MB) (IT)

(72) Inventors: Stefano Ramorini, Arluno (IT); Alberto Cattani, Cislago (IT); Germano Nicollini, Piacenza (IT); Alessandro Gasparini, Cusano Milanino (IT)

(73) Assignee: StMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 16/539,478

(22) Filed: Aug. 13, 2019

(65) Prior Publication Data
US 2019/0372535 A1    Dec. 5, 2019

Related U.S. Application Data

(63) Continuation of application No. 15/984,942, filed on May 21, 2018, now Pat. No. 10,439,569.

(30) Foreign Application Priority Data

May 29, 2017  (IT) .......................... 102017000058135

(51) Int. Cl.
    *H03F 3/21*       (2006.01)
    *H03F 3/217*      (2006.01)
    *H03F 3/45*       (2006.01)
(52) U.S. Cl.
    CPC ....... *H03F 3/2173* (2013.01); *H03F 3/45273* (2013.01); *H03F 2200/456* (2013.01); *H03F 2200/462* (2013.01); *H03F 2200/474* (2013.01)

(58) Field of Classification Search
    CPC ...................................................... H03F 3/2173
    USPC ......................................................... 330/251
    See application file for complete search history.

(56) References Cited

U.S. PATENT DOCUMENTS

| | | | | |
|---|---|---|---|---|
| 6,002,299 A * | 12/1999 | Thomsen | ................ | H03F 1/083 330/107 |
| 7,382,849 B1 * | 6/2008 | Groe | ..................... | H03L 7/0896 327/157 |
| 7,615,981 B2 | 11/2009 | Wong et al. | | |

(Continued)

FOREIGN PATENT DOCUMENTS

| | | |
|---|---|---|
| GB | 2526881 A | 12/2015 |
| JP | 2005333636 A | 12/2005 |

OTHER PUBLICATIONS

IT Search Report and Written Opinion for IT Appl. No. 2017000058135 dated Jan. 23, 2018 (10 pages).

*Primary Examiner* — Patricia T Nguyen
(74) *Attorney, Agent, or Firm* — Crowe & Dunlevy

(57) ABSTRACT

A switching amplifier, such as a Class D amplifier, includes a current sensing circuit. The current sensing circuit is formed by replica loop circuits that are selectively coupled to corresponding output inverter stages of the switching amplifier. The replica loop circuits operated to produce respective replica currents of the output currents generated by the output inverter stages. A sensing circuitry is coupled to receive the replica currents from the replica loop circuits and operates to produce an output sensing signal as a function of the respective replica currents.

30 Claims, 8 Drawing Sheets

(56) References Cited

U.S. PATENT DOCUMENTS

| | | | |
|---|---|---|---|
| 7,777,455 B1* | 8/2010 | Martin | H02J 7/0055 |
| | | | 320/137 |
| 9,960,741 B2 | 5/2018 | Mengad et al. | |
| 2007/0174527 A1 | 7/2007 | Vorenkamp | |
| 2012/0044020 A1* | 2/2012 | Siniscalchi | H03F 3/2173 |
| | | | 330/251 |
| 2013/0285744 A1* | 10/2013 | Fei | H03F 1/523 |
| | | | 330/251 |
| 2016/0013765 A1* | 1/2016 | Peluso | H03F 3/005 |
| | | | 330/260 |
| 2018/0262164 A1 | 9/2018 | Ranta et al. | |

* cited by examiner

Φ1　　Φ2　Φ3 Φ4

Φ1　　Φ2　Φ3 Φ4

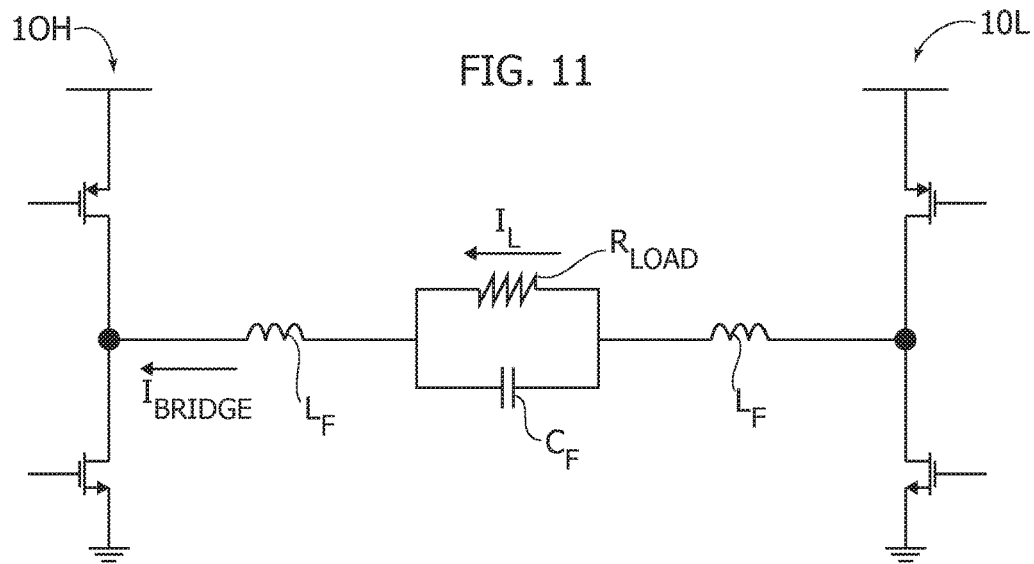
FIG. 11
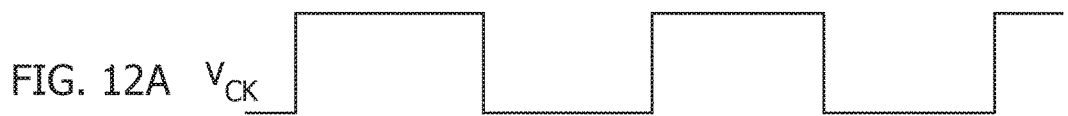
FIG. 12A  $V_{CK}$
FIG. 12B  $OUT_H$
FIG. 12C  $OUT_L$
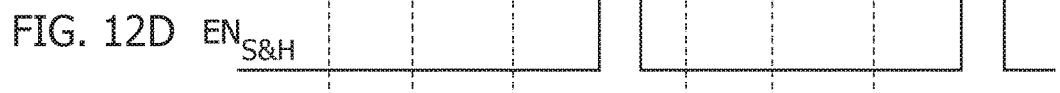
FIG. 12D  $EN_{S\&H}$
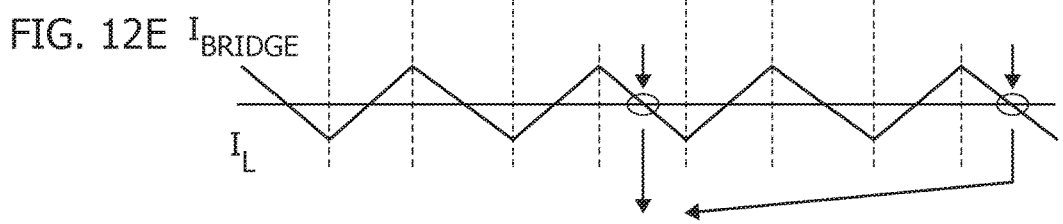
FIG. 12E  $I_{BRIDGE}$

SENSING CIRCUIT, CORRESPONDING AMPLIFIER, APPARATUS AND METHOD

CROSS-REFERENCE TO RELATED APPLICATIONS

This application is a continuation of U.S. patent application Ser. No. 15/984,942 filed May 21, 2018, which claims the priority benefit of Italian Application for Patent No. 102017000058135, filed on May 29, 2017, the disclosures of which are hereby incorporated by reference in their entireties to the maximum extent allowable by law.

TECHNICAL FIELD

The description relates to current sensing in amplifiers.

One or more embodiments may provide a high-precision current sense for switching amplifiers, suitable for a full integration in the amplifier circuit.

BACKGROUND

Various applications involve sensing (for example measuring) the filtered output current of a switching amplifier, for example the output current provided by an amplifier to a load such as a resistive load through a filter such as an external low-pass for example LC filter.

A Class D amplifier may be exemplary of such a switching amplifier.

Despite the extensive activity in that area, improved solutions are desirable in respect of various aspects such as, for example:
- avoiding the possible presence of external components such as an external sense resistance with the associated efficiency loss,
- effectively addressing technological issues as possibly associated to a load terminal reaching levels above the bridge supply voltage of the amplifier or below ground level,
- the possibility of supplying a sense circuit and the output bridges of the amplifier with a same voltage,
- possibly filtering the ripple in the bridge current, for example by sensing its mean value, that is the load current, and
- achieving high accuracy and precision, for example with offset cancellation.

There is a need in the art to contribute in providing such an improved solution.

SUMMARY

One or more embodiments relate to an amplifier (for example a Class D amplifier), a corresponding apparatus (for example, a micromirror application wherein sensing the output current from a Class D amplifier makes it possible to sense spurious current components due to the physical behavior of the mirror) and a corresponding method.

The claims are an integral part of the disclosure of embodiments as provided herein.

One or more embodiments may sense (directly) the current flowing in the output bridges of a switching amplifier such as for example a Class D amplifier.

One or more embodiments may sense (scaled) currents in the (for example NMOS transistor-based) output inverters of the amplifier through a replica loop across each device.

In one or more embodiments, the (for example scaled) currents may be converted into a voltage signal with such a voltage signal possibly buffered to drive an auxiliary circuit for measurement purposes.

In one or more embodiments, high precision is facilitated by using an offset cancellation procedure combined with a sample-and-hold mechanism providing for the cancellation of the ripple which may be present on the bridge current.

In one or more embodiments, a bridge mean current can be sensed which is indicative of the load current.

In one or more embodiments high accuracy is facilitated by resorting to an amplifier auto-zero offset technique.

One or more embodiments may provide cancellation of superposed ripple due to operation of the switching amplifier, thus facilitating accurate sensing of the mean load current.

One or more embodiments facilitate avoiding using any external components such as an external sensing resistor thus increasing driving efficiency.

In an embodiment, a circuit comprises: replica loop circuits couplable to output inverter stages of a switching amplifier producing amplifier output currents, the replica loop circuits configured for producing respective replica currents of the output currents, and a sensing circuit coupled to the replica loop circuits to receive therefrom the respective output current replicas, the sensing circuit configured to produce an output sensing signal as a function of the respective output current replicas from the replica loop circuits.

The sensing circuit may include a current-to-voltage converter circuit configured for converting the respective output current replicas to a voltage output sensing signal. The sensing circuit may further include an output buffer configured for buffering the voltage signal and producing therefrom a buffered sensing signal.

The replica loop circuits may include current mirror circuits providing replicas of the output currents. The current mirror circuits may include a down-scaling current mirror circuit to provide a respective scaled-down replica of the output current.

Where the output inverter stages generate switched output currents having relatively higher and smaller duty-cycles, the replica loop circuits are selectively activated to act on the switched output current from the inverter stages having a smaller duty-cycle.

The replica loop circuit may include a loop amplifier having associated auto-zero circuitry.

A sampling circuit is activated to sample the output sensing signal at timed instants synchronized with a clock signal that is clocking operation of the switching amplifier. Activation of the sampling circuit occurs responsive to a sampling timing signal having rising and falling edges, where the falling edges of the sampling timing signal are synchronized with the rising edges of the clock signal clocking operation of the switching amplifier. The sampled output sensing signal is indicative of a mean value of the output current from the amplifier.

In an embodiment, a method comprises: providing a switching amplifier having output inverter stages producing amplifier output currents, coupling to the output inverter stages of the switching amplifier replica loop circuits producing respective replicas of the output currents, coupling to the replica loop circuits at least one sensing circuit receiving from the replica loop circuits respective output current replicas, and producing via the sensing circuit an output sensing signal as a function of the respective output current replicas.

BRIEF DESCRIPTION OF THE DRAWINGS

One or more embodiments will now be described, by way of example only, with reference to the annexed Figures wherein:

FIG. 11 is a circuit diagram exemplary of possible features of embodiments, and FIGS. 12A through 12E are exemplary of possible timing in operation of embodiments.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
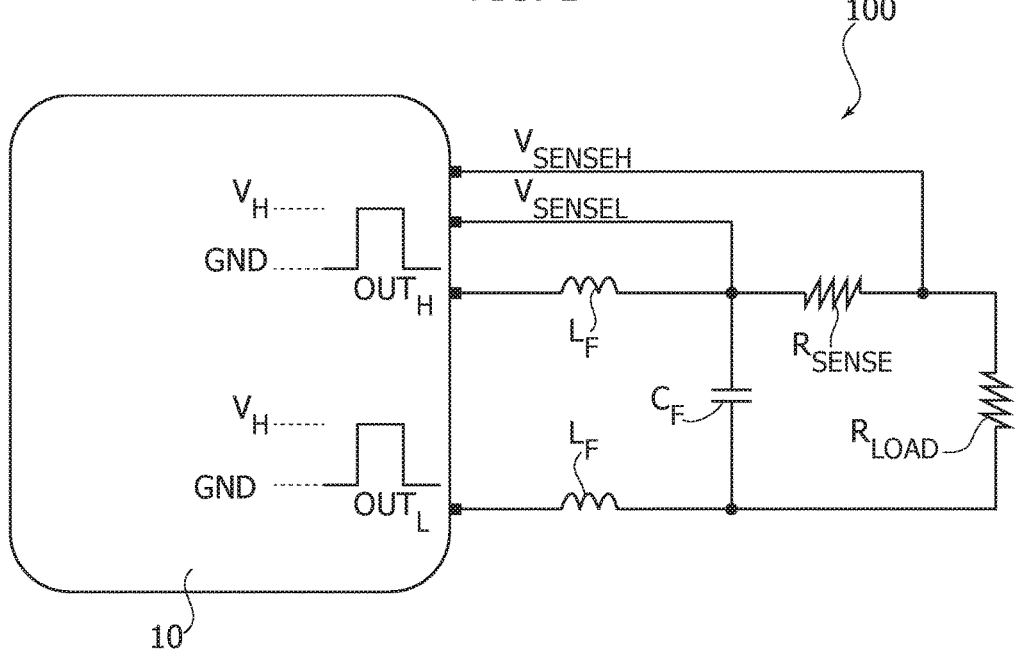
FIG. 1 is a block diagram illustrative of a possible context of use of embodiments.

In FIG. 1, reference 100 indicates as a whole an arrangement including a switching amplifier 10 including outputs $OUT_H$ ("high") and $OUT_L$ ("low") supplying load current to a load $R_{LOAD}$ such as for example a resistive load.

The amplifier 10 may include, for example, a Class D Amplifier with an associated output filter (for example a "pi" low-pass filter) for example including two inductors $L_F$ and a capacitor $C_F$ with the inductors $L_F$ coupled at their "proximal" ends to the amplifier stage 10 to be traversed by the current from the outputs $OUT_H$, $OUT_L$ and the capacitor $C_F$ coupled across the "distal" terminals of the inductors $L_F$ with the (low-pass) filtered signal applied to the load $R_{LOAD}$.

The principles underlying operation of such a switching amplifier arrangement are known in the art, thus making it unnecessary to provide a more detailed description herein.

As noted, a Class D amplifier with quaternary modulation may be exemplary of such an application. A possible scenario of use of such an arrangement is a micromirror application wherein sensing the output current from the Class D amplifier makes it possible to sense spurious current components due to the physical behavior of the mirror. These currents may thus be compensated by means of a cancelling process to increase mirror driving accuracy. Reference to that possible area of application is merely exemplary and not meant to be limiting of the scope of embodiments.

In various applications, operation of the amplifier 10 will involve sensing (for example measuring) the filtered output signal (current) from the amplifier 10 as exemplary of the current supplied to the load $R_{LOAD}$ through the external (for example LC) filter.

FIG. 1 is exemplary of performing such a sensing action via a sensing resistor $R_{SENSE}$ arranged in series with the load $R_{LOAD}$, with the voltage drop $V_{SENSEH}$–$V_{SENSEL}$ across the resistor $R_{SENSE}$ indicative of the magnitude of the current supplied to the load $R_{LOAD}$.

As noted, such an arrangement may undesirably involve the use of an external component such as the resistor $R_{SENSE}$ with an associated efficiency loss.

Figure 2:
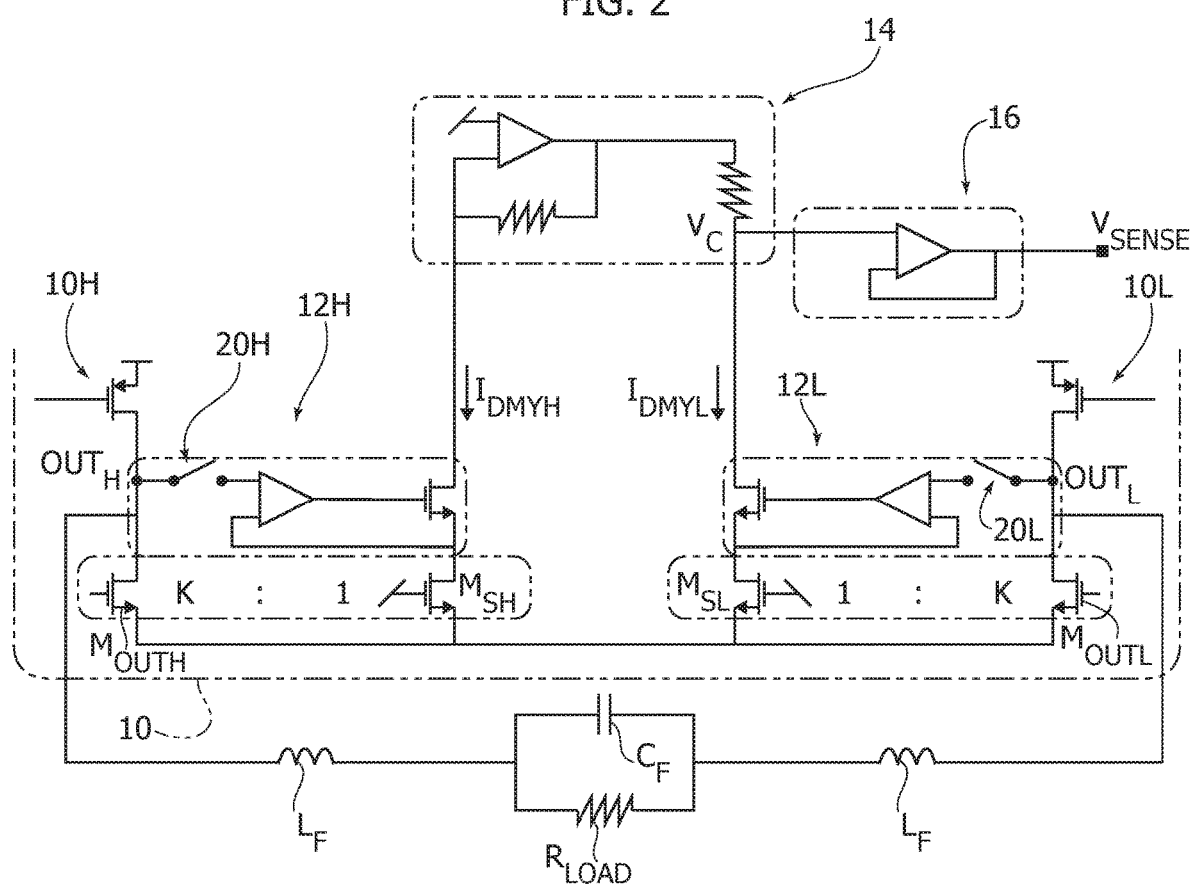
FIG. 2 is a circuit diagram exemplary of embodiments.

A general exemplary layout of one or more embodiments is shown in FIG. 2, where 10H and 10L indicate the output inverter stages of the switching amplifier 10 (not visible as a whole in FIG. 2).

The output nodes $OUT_H$, $OUT_L$ of the inverter stages 10H, 10L provide output currents to be supplied to the load $R_{LOAD}$ via the filter $L_F$, $C_F$.

One or more embodiments may include replica loop circuits 12H, 12L to provide replicas (for example scaled-down replicas) $I_{DMYH}$, $I_{DMYL}$ of the currents supplied towards the load $R_{LOAD}$ via the output nodes $OUT_H$, $OUT_L$ of the amplifier 10.

In one or more embodiments, the replica loop circuits 12H, 12L may be integrated in the amplifier 10.

Reference 14 in FIG. 2 indicates a current-to-voltage converter sensitive to the replica currents $I_{DMYH}$, $I_{DMYL}$ and configured for generating a corresponding output (voltage) signal $V_C$ which may be fed to an output buffer circuit 16 to produce an output sensing signal (for example a voltage signal) $V_{SENSE}$.

In one or more embodiments the converter circuit 14 and/or the output buffer 16 may be integrated in the amplifier 10 as previously indicated for the replica loop circuits 12H, 12L.

In one or more embodiments, operation of the replica loop circuits 12H, 12L may be controlled (as schematically indicated by switches 20H, 20L in FIG. 2) in such a way that the replica loop circuits 12H, 12L may be rendered active on the switching (for example Class D) output inverter 10H, 10L having the smaller duty-cycle as conventionally contemplated for Class D operation.

Figure 3:
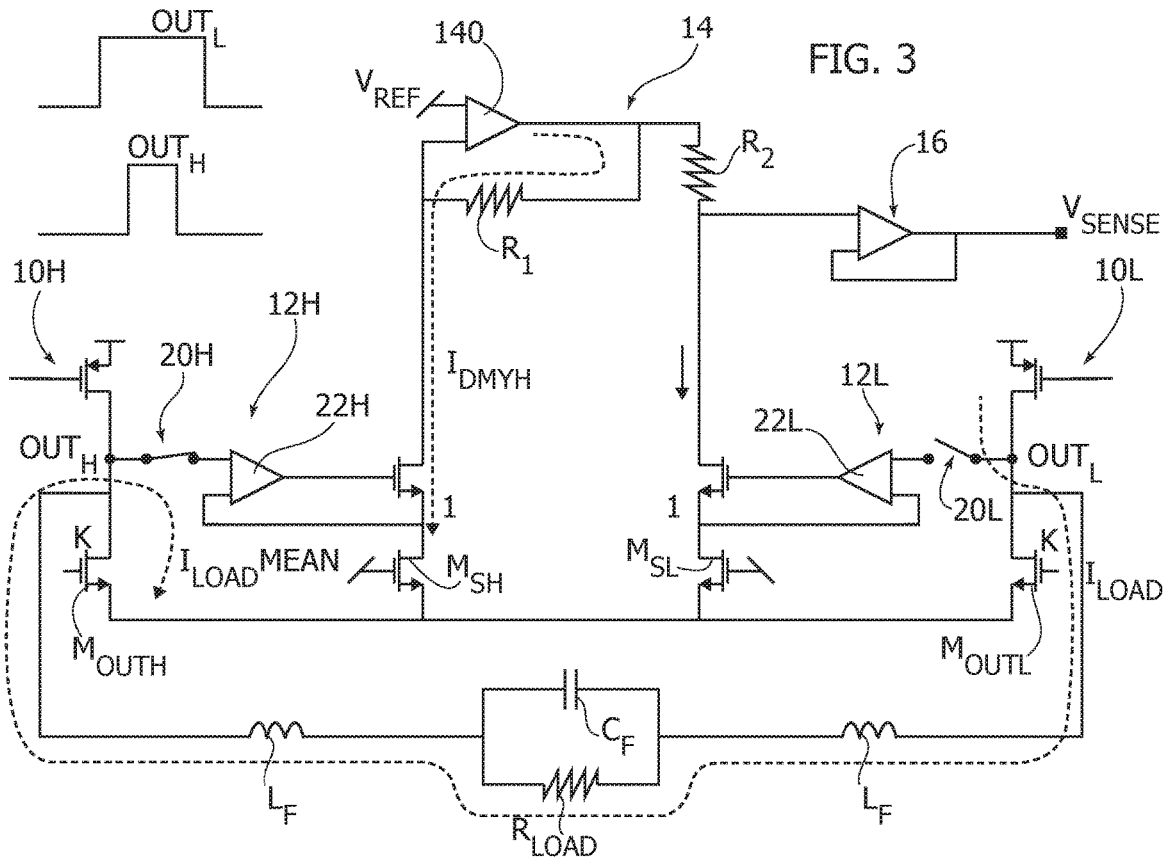
FIGS. 3 and 4 are diagrams exemplary of possible operation of the circuit of FIG. 2.
Figure 4:
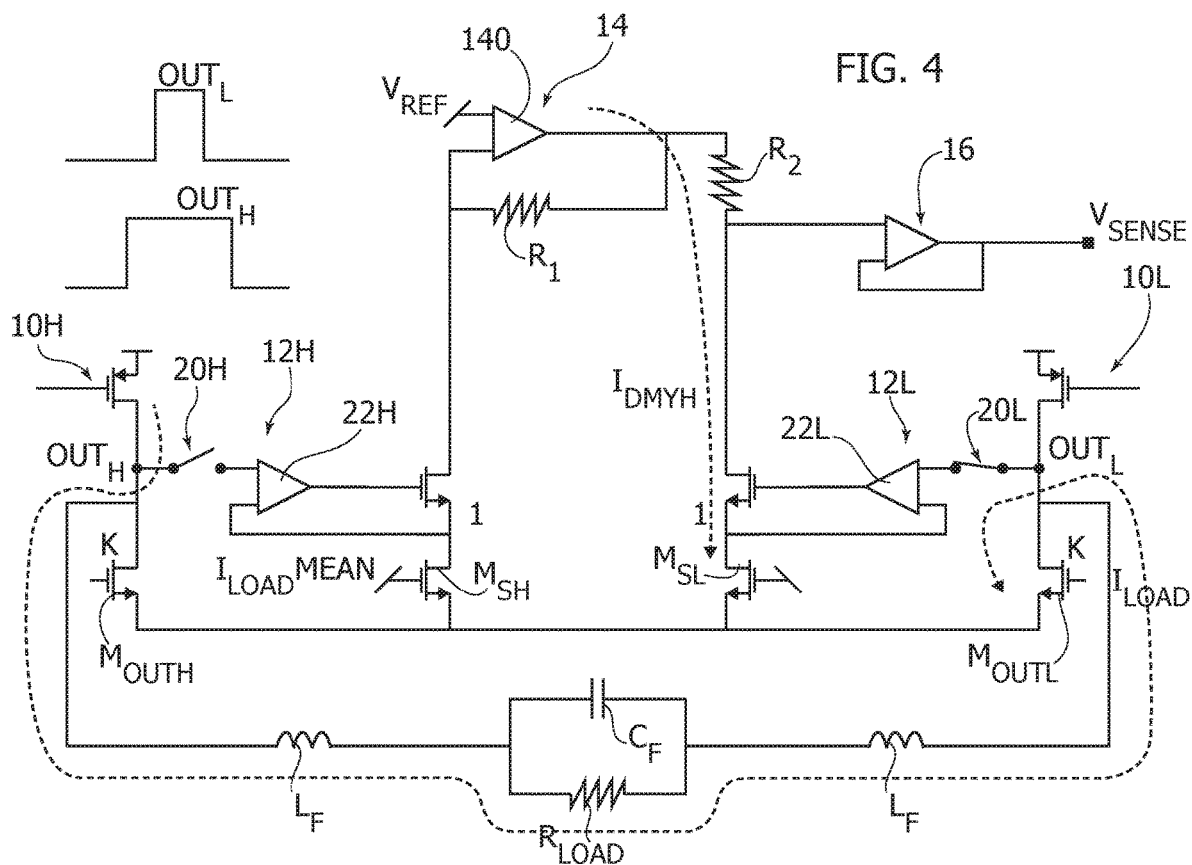

This type of operation is exemplified in FIGS. 3 and 4 with reference to situations where:
- the duty-cycle at output node $OUT_L$ is higher than the duty-cycle at output node $OUT_H$ (FIG. 3), and
- the duty-cycle at output node $OUT_L$ is lower than the duty-cycle at output node $OUT_H$ (FIG. 4).

As used herein, "higher" and "lower" are intended to refer to relative duty-cycle values $T_{ON}/(T_{ON}+T_{OFF})$ of the switched (for example PWM modulated) signals.

In one or more embodiments, the replica loop circuits 12H, 12L may include K:1 current mirrors including two transistors (for example NMOS transistors), namely:

$M_{OUTH}$ and $M_{SH}$ (this latter providing $I_{DMYH}$), and $M_{OUTL}$ and $M_{SL}$ (this latter providing $I_{DMYL}$).

In the situation exemplified in FIG. 3, the load current $I_L$ flows from the output node $OUT_L$ to the node $OUT_H$ through the external LC filter so that (only) $M_{OUTH}$ is traversed by this current which is mirrored (and scaled down) by the replica loop circuit 12H.

The two transistors $M_{OUTH}$ and $M_{SH}$ in the K:1 current mirror have their control electrodes (gates in the case of a field effect transistors such as MOS transistors) in common and the replica loop includes a differential stage 22H which forces their, for example, drain nodes to be equal, thus providing current mirroring and scaling (by a factor K), so that $I_{DMYH}=I_L/K$.

The replica loop 12H being active is exemplified by the switch 20H being represented in a closed (that is conductive) condition.

In an arrangement as exemplified in the figures, the mirrored, scaled-down current flows through a feedback resistor R1 of an amplifier 140 included in the current/voltage converter 14.

In an arrangement as exemplified in the figures the amplifier 140 includes a differential stage receiving a (voltage) reference signal $V_{REF}$ at one of its inputs (for example non-inverting) with the feedback resistor R1 coupled to the replica loop circuit 12H at the other (for example inverting) input.

In an arrangement as exemplified in the figures, an output resistor R2 is set between the output of the differential stage 140 and the buffer stage 16 (and the loop replica circuit 12L).

The current flowing in the feedback resistor of the differential stage 140 of the converter 14 may be buffered at 16 to generate an output signal $V_{SENSE}=V_{REF}+I_{DMYH}$.

Operation in the complementary conditions as exemplified in FIG. 4 is essentially identical save that the two loop replica circuits 12H, 12L "swap" their roles with the loop 12L leading to the generation of a current $I_{DMYL}=I_L/K$ which flows in the output resistor R2 of the amplifier 140 in the converter 14 and is buffered to generate a sensing signal $V_{SENSE}=V_{REF}-I_{DMYL}*R2/K$.

Figure 5:
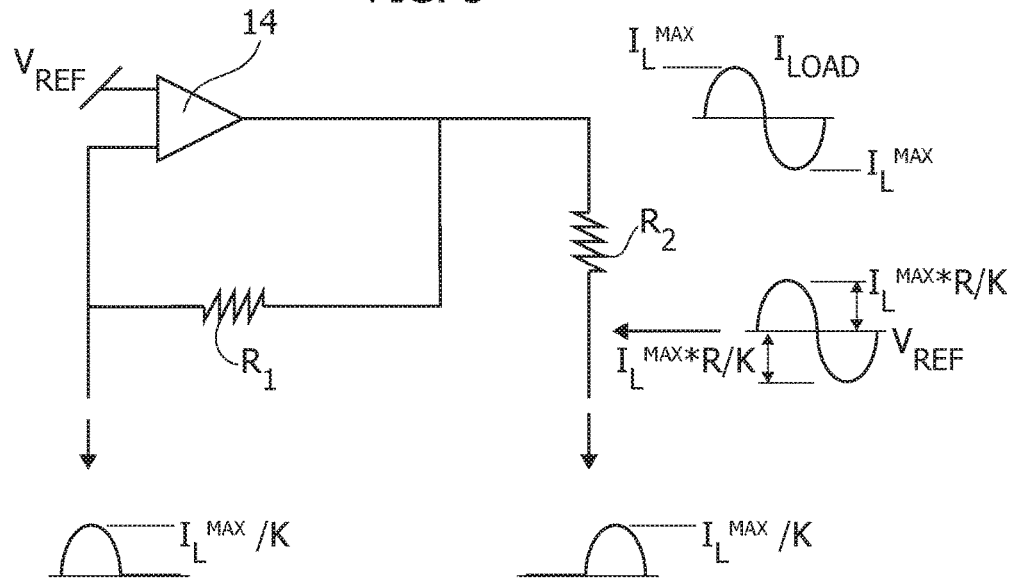
FIG. 5 is further exemplary of the principles of operation exemplified in FIGS. 3 and 4.

By combining the two sense paths the signal $V_{SENSE}$ provides a good replica of the load current(s) of the switching (for example Class D) amplifier as shown in the right-hand side of FIG. 5 (assuming for example R1=R2=R).

As discussed previously, the replica loops 12H, 12L may operate with the target of facilitating rendering the drains of the transistors $M_{OUTH,L}$ and $M_{SH,L}$ (where $M_{OUTH,L}$ indicates $M_{OUTH}$ and $M_{OUTL}$, while $M_{SH,L}$ indicates $M_{SH}$ and $M_{SL}$) equal.

However, it was observed that the transistors $M_{OUTH,L}$ may exhibit (very) small values for the "on" resistance $R_{ON}$, this resulting in a correspondingly small value for $V_{OUT}$ even with relatively high load currents.

As a result, a correct operation of the replica loop circuit may be facilitated by the loop amplifiers 22H, 22L having an offset comparable or smaller than $V_{OUT}$.

For that reason, one or more embodiments may adopt an amplifier "auto-zero" technique in order to achieve high accuracy.

Figure 6:
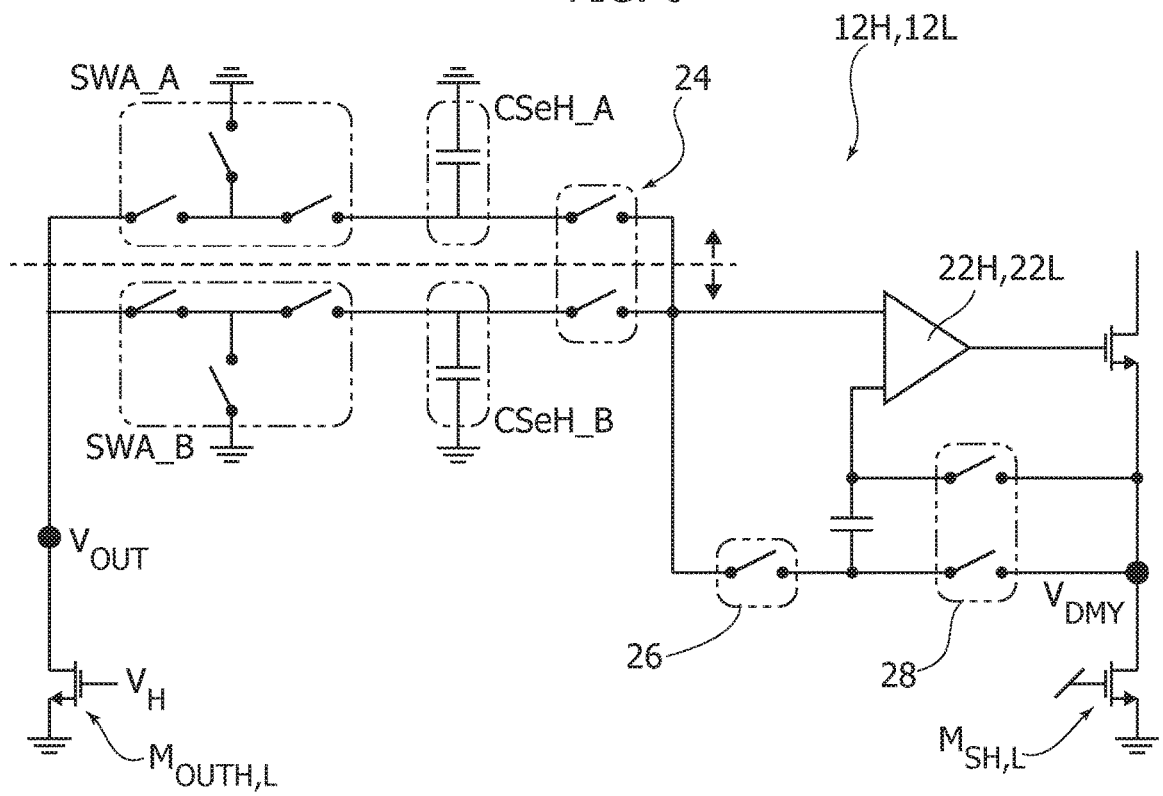
FIG. 6 is a simplified circuit diagram exemplary of possible operation of embodiments.

FIG. 6 is exemplary of a possible implementation of a replica loop with auto-zero, where the representation of FIG. 6 applies to both replica loop circuits 12H, 12L including the loop amplifiers 22H, 22L.

The chronograms of FIGS. 7A through 7D are exemplary of the timing of operation of switches SWA_A, SWA_B and 24, 26, 28 in four working phases as represented in FIGS. 7A through 7D by a $\Phi 1$, $\Phi 2$, $\Phi 3$ and $\Phi 4$.

Figure 7A:
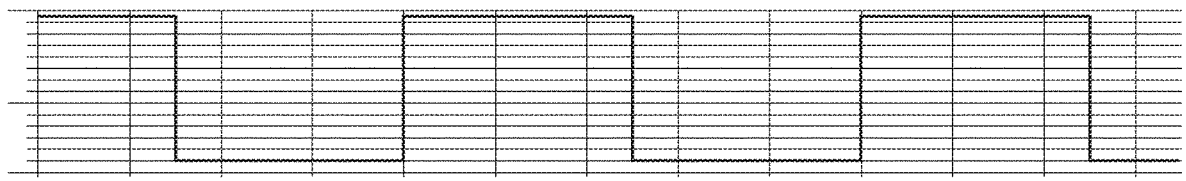
FIGS. 7A through 7D are exemplary of possible timing in operation of embodiments.
Figure 7B:
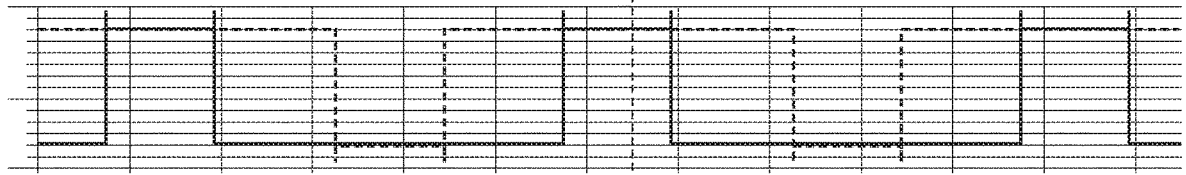
Figure 7C:
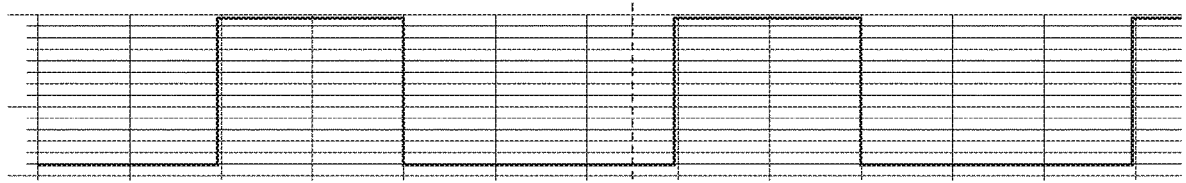
Figure 7D:
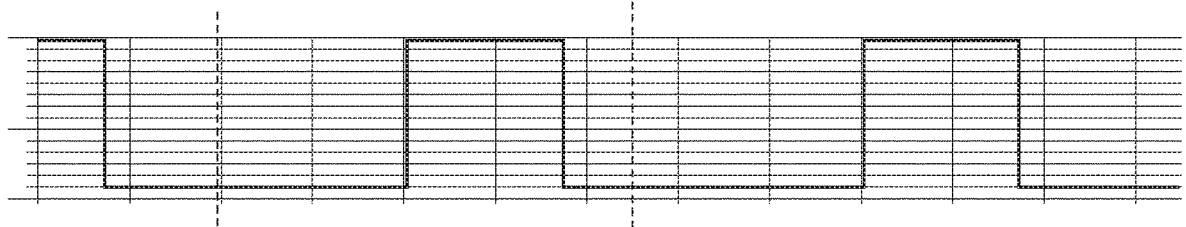
Figure 8A:
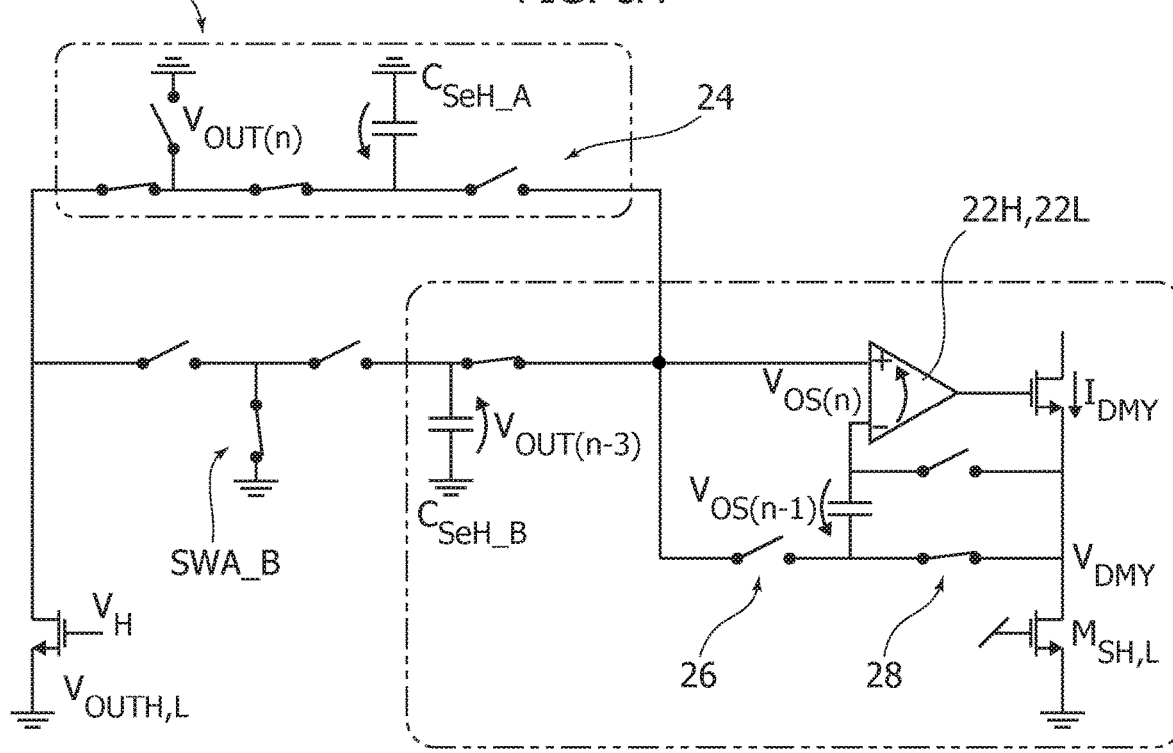
FIGS. 8A through 8D are exemplary of another circuit representation exemplary of possible operation of embodiments.
Figure 8B:
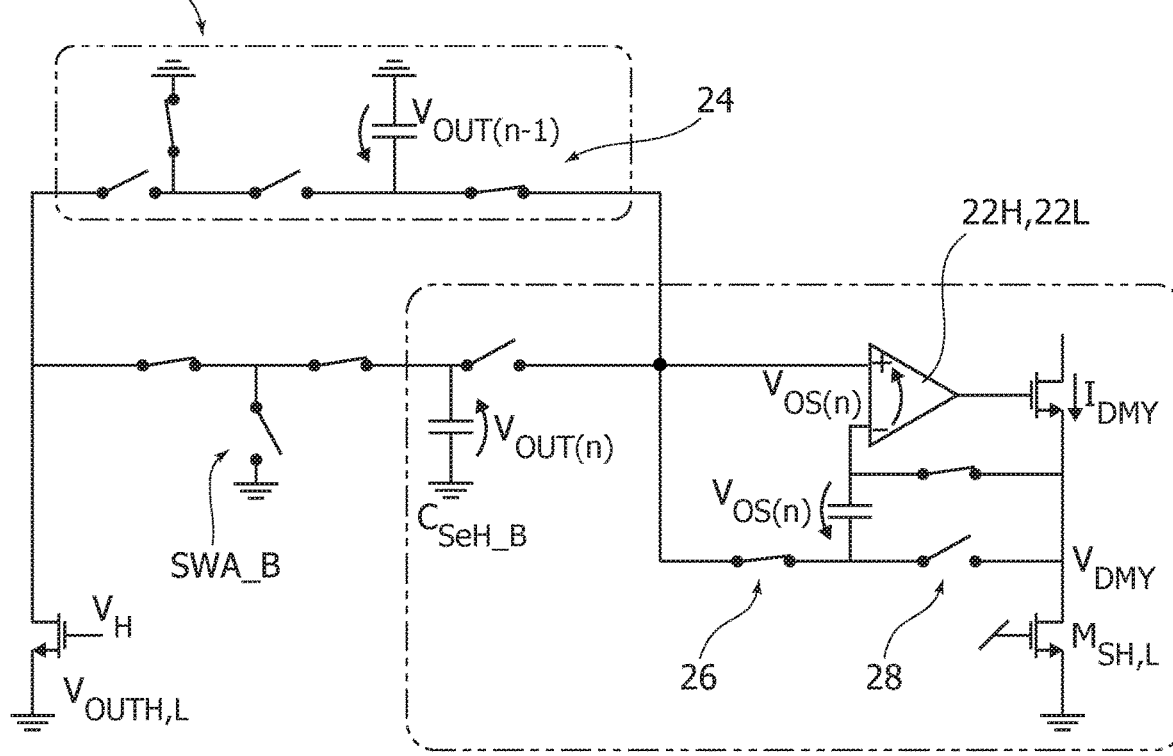
Figure 8C:
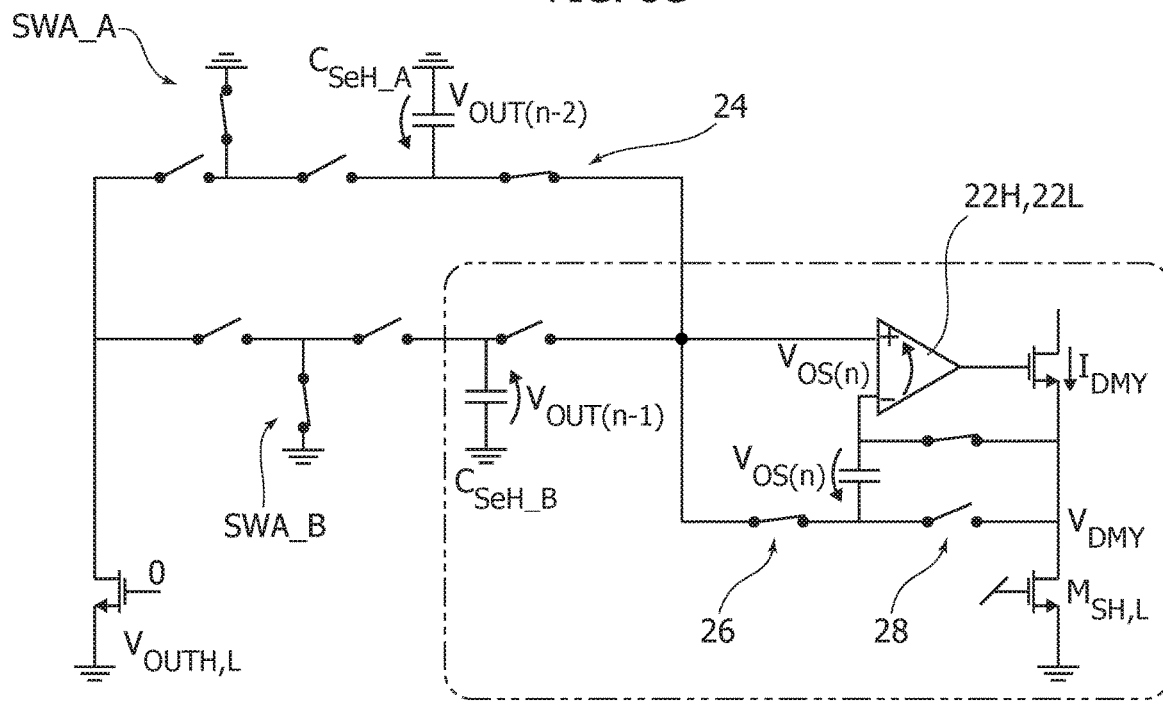
Figure 8D:
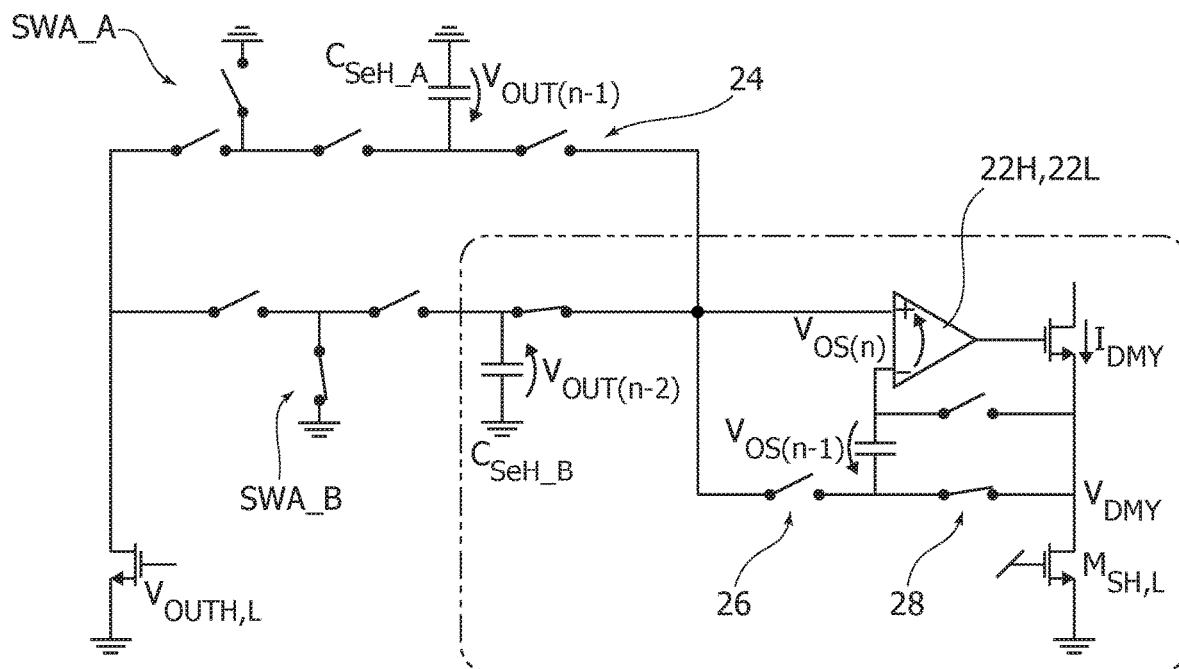

In the four diagrams of FIGS. 7A through 7D:
the diagram of FIG. 7A is exemplary of the clock signal used for switching (Class D modulation),
the diagrams in FIG. 7B (dashed line and solid line) are exemplary of the outputs of the two single-ended Class D nodes, with the replica branch 12H, 12L active only on the output node having the smaller duty-cycle as discussed previously in connection with FIGS. 3 and 4,
the diagram in FIG. 7C is exemplary of the enable signal for the switch SWA_A causing the output voltage from the transistor $M_{OUTH,L}$ to be sampled on a capacitor CSeH_A, and
the diagram in FIG. 7D is exemplary of the enable signal for the switch SWA_B causing the output voltage from the transistor $M_{OUTH,L}$ to be sampled on capacitor CSeH_B.

FIGS. 8A through 8D are exemplary of the various enable (switch ON, that is conductive) and non-enable (switch OFF, that is non-conductive) conditions of the various switches presented in FIG. 6 in the four phases $\Phi 1$, $\Phi 2$, $\Phi 3$, $\Phi 4$.

Briefly (in the following the suffixes "H" and "L" distinguishing the two replica loop circuits are dropped for simplicity, operation of two circuits being otherwise the same):

$\Phi 1$ (FIG. 8A): $M_{OUT}$ is ON→$V_{OUT}[n]=R_{ON}*I_L$. $V_{OUT}[n]$ is sampled on $C_{SeH\_A}$, whereas the amplifier is in Sensing Phase using $V_{OUT}[n-3]$ (voltage sampled on $C_{SeH\_B}$ in $\Phi 2$ of the previous clock cycle) as the reference voltage→$V_{DMY}=V_{OUT}[n-3]-V_{OS}[n]+V_{OS}[n-1]$ and since $V_{OS}[n]=V_{OS}[n-1]$→$V_{DMY}=V_{OUT}[n-3]$→$I_{DMY}=I_L/K$→$I_{DMY}$ in this phase is directly proportional to $I_L$ and can be used to generate $V_{SENSE}$.

$\Phi 2$ (FIG. 8B): $M_{OUT}$ is ON→$V_{OUT}[n]=R_{ON}*I_L$. $V_{OUT}[n]$ is sampled on $C_{SeH\_B}$, whereas the amplifier is in Autozero Phase using $V_{OUT}[n-1]$ (voltage sampled on $C_{SeH\_A}$ in $\Phi 1$ of the same clock cycle) as the reference voltage→$V_{DMY}=V_{OUT}[n-1]-V_{OS}[n]$→$I_{DMY}=I_L/K+V_{OS}[n]/(K*R_{ON})$. The term $V_{OS}[n]/(K*R_{ON})$ represents an error, thus the $I_{DMY}$ current, during this phase, is not useful for generating $V_{SENSE}$.

$\Phi 3$ (FIG. 8C): $M_{OUT}$ is OFF Both SWA_A and SWA_B are open. The amplifier is in Autozero Phase using $V_{OUT}[n-2]$ (voltage sampled on $C_{seH\_A}$ in $\Phi 1$ of the same clock cycle) as the reference voltage→$V_{DMY}=V_{OUT}[n-2]-V_{OS}[n]$→$I_{DMY}=I_L/K+V_{OS}[n]/(K*R_{ON})$. The term $V_{OS}[n]/(K*R_{ON})$ represents an error, thus the $I_{DMY}$ current, during this phase, is not useful for generating $V_{SENSE}$.

$\Phi 4$ (FIG. 8D): $M_{OUT}$ is OFF Both SWA_A and SWA_B are open. The amplifier is in Sensing Phase using $V_{OUT}[n-2]$ (voltage sampled on $C_{SeH\_B}$ in f2 of the same clock cycle) as the reference voltage→$V_{DMY}=V_{OUT}[n-2]-V_{OS}[n]+V_{OS}[n-1]$ and since $V_{OS}[n]=V_{OS}[n-1]$→$V_{DMY}=V_{OUT}[n-2]$→$I_{DMY}=I_L/K$→$I_{DMY}$ in this phase is directly proportional to $I_L$ and can be used to generate $V_{SENSE}$.

After the replica current $I_{DMY}$ (that is $I_{DMYH}$ or $I_{DMYL}$, respectively, as a function of the active replica loop circuit considered) is converted to voltage, the output from the converter 14 may be sampled during the phase $\Phi 1$, that is when this is (directly) proportional to $I_L$ and is exempt from error, thanks to offset cancellation thus facilitating buffering at 16 to drive a load.

Figure 9:
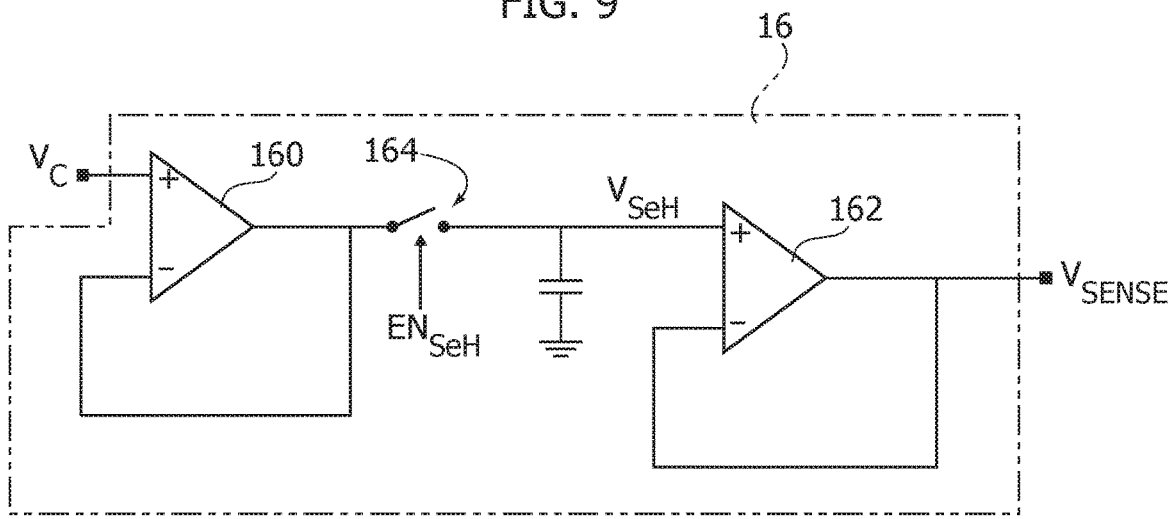
FIG. 9 is a circuit diagram exemplary of possible features of embodiments.
Figure 10A:
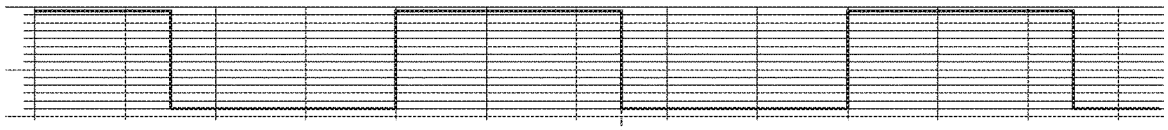
FIGS. 10A through 10E are exemplary of possible timing in operation of embodiments.
Figure 10B:
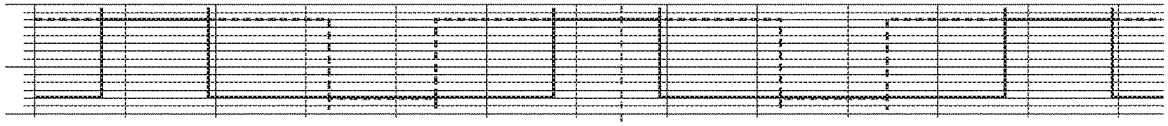
Figure 10C:
Figure 10D:
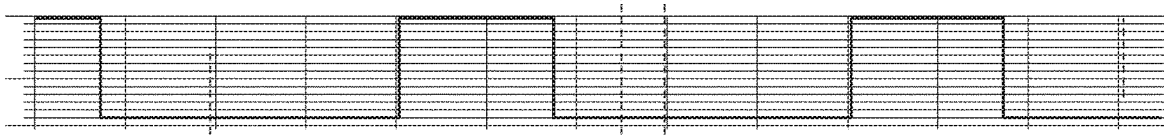
Figure 10E:
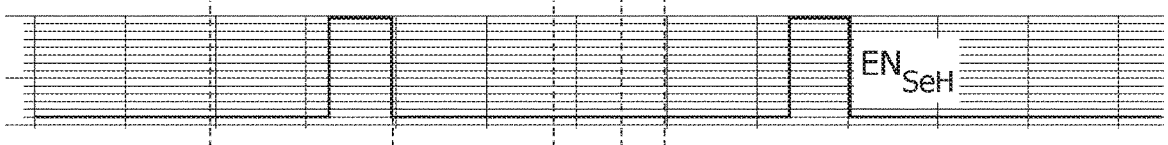

In one or more embodiments such a sampling action can be implemented in the buffer circuit 16 as schematically illustrated in FIG. 9.

In FIG. 9 reference 160 indicates an input stage receiving the signal Vc from the converter circuit 14 and reference 162 indicates an output stage providing an output sensing signal $V_{SENSE}$.

In FIG. 9 a sampling switch $EN_{seH}$ 164 set between the input and output stages 160, 162 of the buffer circuit 16 is exemplary of a possible implementation of the sampled output buffer with the respective sampling timing signal $EN_{S\&H}$ added to the diagrams of FIGS. 7A through 7D as shown in the lower portion of FIGS. 10A through 10E thus showing that the replica current may be effectively sampled at the end of the phase Φ1.

The foregoing discussion assumes that the mean value $I_L$ of the load current (for example a sinusoidal current if the input to the switching amplifier for example Class D input) is a sine wave.

In one or more embodiments, the load current designated $I_{BRIDGE}$ may have superimposed a ripple due to the way of working of a Class D amplifier.

An accurate sensing of the mean (average) load current is facilitated by such a current ripple being cancelled.

In one or more embodiments, deriving the falling edge of the sampling signal $EN_{S\&H}$ signal from the rising edge of the clock used for Class D modulation (see for example the diagrams a) in FIGS. 7A through 7D and FIG. 9) may facilitate having the voltage sample at the end of $EN_{S\&H}$ to correspond (exactly) to the mean load current $I_L$.

In that way, the possibility exists of automatically filtering the ripple of the bridge current as exemplified in the diagrams of the FIGS. 12A through 12E designate:

FIG. 12A: the clock signal used for Class D modulation $V_{CK}$,

FIGS. 12B and 12C: the outputs form the two output nodes of the Class D amplifier $OUT_H$, $OUT_L$, FIG. 12D: the sampling signal $EN_{S\&H}$, and FIG. 12E: a possible "sawtooth" behavior (deliberately emphasized for ease of understanding) of the ripple $I_{BRIDGE}$ with respect to the average value $I_L$.

FIG. 12E exemplifies how sampling taking place as discussed previously makes it possible to automatically filter out such a ripple.

A circuit arrangement according to one or more embodiments may include:

replica loop circuits (for example 12H, 12L) couplable to output inverter stages (for example 10H, 10L) of a switching amplifier (for example 10) producing amplifier output currents, the replica loop circuits configured for producing respective replicas (for example $I_{DMYH}$, $I_{DMYL}$) of the output currents from the output inverter stages, and at least one sensing circuit (for example 14, 16) coupled to the replica loop circuits to receive therefrom the respective output current replicas, the sensing circuit configured to produce an output sensing signal (for example $V_{SENSE}$) as a function of the respective output current replicas from the replica loop circuits.

In one or more embodiments the at least one sensing circuit may include a current-to-voltage converter circuit (for example 14) configured for converting the respective output current replicas to a voltage output sensing signal.

In one or more embodiments the at least one sensing circuit may include an output buffer (for example 16) configured for buffering the voltage signal and producing therefrom a buffered sensing signal (for example $V_{SENSE}$).

In one or more embodiments, the replica loop circuits may include current mirrors (for example $M_{OUTH}$, $M_{SH}$; $M_{OUTL}$, $M_{SL}$) providing replicas of the output currents.

In one or more embodiments, the current mirrors may include down-scaling current mirrors provide respective scaled-down replicas of the output currents.

In one or more embodiments, with the output inverter stages generating switched output currents having relatively higher and smaller duty-cycles, the replica loop circuits may be selectively activatable (for example 20H, 20L) to act on the switched output current from the inverter stages having a smaller duty-cycle.

In one or more embodiments, the replica loop circuits may include loop amplifiers (for example 22H, 22L) having associated auto-zero circuitry (for example SWA_A, SWA_B, CSeH_A, CSeH_B, 24, 26, 28).

One or more embodiments may include a sampling circuit (for example 164) activatable to sample the output sensing signal at timed instants synchronized (for example $EN_{S\&H}$) with a clock signal (for example $V_{CK}$) clocking operation of the switching amplifier.

One or more embodiments may include a sampling circuit activatable by a sampling timing signal having rising and falling edges, the falling edges of the sampling timing signal synchronized with the rising edges of the clock signal clocking operation of the switching amplifier (10), whereby the sampled output sensing signal is indicative of the mean value of the output current from the amplifier.

One or more embodiments may include a switching amplifier (for example a Class D amplifier) including output inverter stages producing amplifier output currents, the amplifier including a circuit arrangement according to one or more embodiments.

Apparatus according to one or more embodiments may include a switching amplifier according to one or more embodiments.

A method according to one or more embodiments may include:

providing a switching amplifier having output inverter stages producing amplifier output currents, coupling to the output inverter stages of the switching amplifier replica loop circuits producing respective replicas of the output currents, and coupling to the replica loop circuits at least one sensing circuit receiving from the replica loop circuits respective output current replicas, producing via the sensing circuit an output sensing signal as a function of the respective output current replicas.

Without prejudice to the underlying principles, the details and embodiments may vary, even significantly, with respect to what has been described by way of example only, without departing from the extent of protection.

The extent of protection is defined by the annexed claims.

The invention claimed is:

1. A circuit, comprising:
   a current mirror comprising an output drive transistor having a source node and a drain node and a current sensing transistor having a source node and a drain node;
   a differential amplifier having a first input coupled to the drain node of the output drive transistor and a second input coupled to the drain node of the current sensing transistor;
   a further transistor having a gate node coupled to an output of the differential amplifier, a source node coupled to the drain node of the current sensing transistor and a drain node generating a replica current output; and an auto-zero circuit, comprising:
a first switched capacitor circuit path coupled between the drain node of the output drive transistor and the first input of the differential amplifier; and
a second switched capacitor circuit path coupled between the drain node of the output drive transistor and the first input of the differential amplifier.

2. The circuit of claim 1, further comprising:
a control of the first switched capacitor circuit path in a first operational phase to sample a voltage at the drain of the output drive transistor;
a control of the first switched capacitor circuit path in a second operational phase to apply the sampled voltage to the first input of the differential amplifier.

3. The circuit of claim 2, further comprising a control to turn on the output drive transistor during the first and second operational phases.

4. The circuit of claim 2, wherein the auto-zero circuit further comprises:
a capacitor having a first terminal and a second terminal, wherein the second terminal is coupled to the second input of the differential amplifier;
a first switch coupled between the first input of the differential amplifier and the first terminal of the capacitor;
a second switch coupled between the second terminal and the drain node of the current sensing transistor; and
a third switch coupled between the first terminal and the drain node of the current sensing transistor.

5. The circuit of claim 4, further comprising:
a control of the first switch to close during the first operational phase;
a control of the second switch to close during the first operational phase; and
a control of the third switch to open during the first operational phase.

6. The circuit of claim 4, further comprising:
a control of the first switch to open during the second operational phase;
a control of the second switch to open during the second operational phase; and
a control of the third switch to close during the second operational phase.

7. The circuit of claim 2, further comprising:
a control of the second switched capacitor circuit path in the first operational phase to apply a previously sampled voltage at the drain of the output drive transistor to the first input of the differential amplifier; and
a control of the second switched capacitor circuit path in the second operational phase to sample a voltage at the drain of the output drive transistor.

8. The circuit of claim 7, further comprising a control to turn on the output drive transistor during the first and second operational phases.

9. The circuit of claim 7, wherein the auto-zero circuit further comprises:
a capacitor having a first terminal and a second terminal, wherein the second terminal is coupled to the second input of the differential amplifier;
a first switch coupled between the first input of the differential amplifier and the first terminal of the capacitor;
a second switch coupled between the second terminal and the drain node of the current sensing transistor; and
a third switch coupled between the first terminal and the drain node of the current sensing transistor.

10. The circuit of claim 9, further comprising:
a control of the first switch to close during the first operational phase;
a control of the second switch to close during the first operational phase; and
a control of the third switch to open during the first operational phase.

11. The circuit of claim 9, further comprising:
a control of the first switch to open during the second operational phase;
a control of the second switch to open during the second operational phase; and
a control of the third switch to close during the second operational phase.

12. The circuit of claim 2, further comprising:
a control of the first switched capacitor circuit path in a third operational phase to apply the sampled voltage to the first input of the differential amplifier; and
a control of the first switched capacitor circuit path in a fourth operational phase to isolate a capacitance of the first switched capacitor circuit path from both the drain of the output drive transistor and the first input of the differential amplifier.

13. The circuit of claim 12, further comprising a control to turn off the output drive transistor during the third and fourth operational phases.

14. The circuit of claim 12, wherein the auto-zero circuit further comprises:
a capacitor having a first terminal and a second terminal, wherein the second terminal is coupled to the second input of the differential amplifier;
a first switch coupled between the first input of the differential amplifier and the first terminal of the capacitor;
a second switch coupled between the second terminal and the drain node of the current sensing transistor; and
a third switch coupled between the first terminal and the drain node of the current sensing transistor.

15. The circuit of claim 14, further comprising:
a control of the first switch to close during the fourth operational phase;
a control of the second switch to close during the fourth operational phase; and
a control of the third switch to open during the fourth operational phase.

16. The circuit of claim 14, further comprising:
a control of the first switch to open during the third operational phase;
a control of the second switch to open during the third operational phase; and
a control of the third switch to close during the third operational phase.

17. The circuit of claim 12, further comprising:
a control of the second switched capacitor circuit path in the third operational phase to isolate a capacitance of the second switched capacitor circuit path from both the drain of the output drive transistor and the first input of the differential amplifier; and
a control of the second switched capacitor circuit path in the fourth operational phase to apply a previously sampled voltage at the drain of the output drive transistor to the first input of the differential amplifier.

18. The circuit of claim 17, further comprising a control to turn off the output drive transistor during the third and fourth operational phases.

19. The circuit of claim 17, wherein the auto-zero circuit further comprises:

a capacitor having a first terminal and a second terminal, wherein the second terminal is coupled to the second input of the differential amplifier;

a first switch coupled between the first input of the differential amplifier and the first terminal of the capacitor;

a second switch coupled between the second terminal and the drain node of the current sensing transistor; and a third switch coupled between the first terminal and the drain node of the current sensing transistor.

20. The circuit of claim 19, further comprising:
a control of the first switch to close during the fourth operational phase;
a control of the second switch to close during the fourth operational phase; and
a control of the third switch to open during the fourth operational phase.

21. The circuit of claim 19, further comprising:
a control of the first switch to open during the third operational phase;
a control of the second switch to open during the third operational phase; and
a control of the third switch to close during the third operational phase.

22. A circuit, comprising:
a current mirror comprising an output drive transistor having a source node and a drain node and a current sensing transistor having a source node and a drain node;
a differential amplifier having a first input coupled to the drain node of the output drive transistor and a second input coupled to the drain node of the current sensing transistor;
a further transistor having a gate node coupled to an output of the differential amplifier, a source node coupled to the drain node of the current sensing transistor and a drain node generating a replica current output; and
an auto-zero circuit, comprising:
a capacitor having a first terminal and a second terminal, wherein the second terminal is coupled to the second input of the differential amplifier;
a first switch coupled between the first input of the differential amplifier and the first terminal of the capacitor;
a second switch coupled between the second terminal and the drain node of the current sensing transistor; and
a third switch coupled between the first terminal and the drain node of the current sensing transistor.

23. The circuit of claim 22, further comprising:
a control of the first switch to close during a first operational phase;
a control of the second switch to close during the first operational phase; and
a control of the third switch to open during the first operational phase.

24. The circuit of claim 23, further comprising a control to turn on the output drive transistor during the first operational phase.

25. The circuit of claim 23, further comprising:
a control of the first switch to open during a second operational phase;
a control of the second switch to open during the second operational phase; and
a control of the third switch to close during the second operational phase.

26. The circuit of claim 25, further comprising a control to turn on the output drive transistor during the first and second operational phases.

27. The circuit of claim 22, further comprising:
a control of the first switch to open during a third operational phase;
a control of the second switch to open during the third operational phase; and
a control of the third switch to close during the first operational phase.

28. The circuit of claim 27, further comprising a control to turn off the output drive transistor during the third operational phase.

29. The circuit of claim 27, further comprising:
a control of the first switch to close during a fourth operational phase;
a control of the second switch to close during the fourth operational phase; and
a control of the third switch to open during the fourth operational phase.

30. The circuit of claim 29, further comprising a control to turn off the output drive transistor during the third and fourth operational phases.

* * * * *